(12) United States Patent
Tsukamoto

(10) Patent No.: US 7,907,075 B2
(45) Date of Patent: Mar. 15, 2011

(54) SEMICONDUCTOR DEVICE

(75) Inventor: Sanroku Tsukamoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/611,378

(22) Filed: Nov. 3, 2009

(65) Prior Publication Data
US 2010/0117882 A1 May 13, 2010

(30) Foreign Application Priority Data

Nov. 13, 2008 (JP) .................................. 2008-291101

(51) Int. Cl.
*H03M 1/12* (2006.01)
(52) U.S. Cl. ........................................ 341/155; 341/136
(58) Field of Classification Search .................. 341/135, 341/136, 155
See application file for complete search history.

(56) References Cited

U.S. PATENT DOCUMENTS

| 6,040,610 | A  | * | 3/2000 | Noguchi et al. | ............... | 257/392 |
| 6,700,149 | B2 | * | 3/2004 | Tille et al. | ..................... | 257/296 |
| 7,315,196 | B2 | * | 1/2008 | Wada | ............................. | 327/536 |

FOREIGN PATENT DOCUMENTS

| JP | 11-68476 | 3/1999 |
| JP | 11-224496 | 8/1999 |
| JP | 2002-033663 | 1/2002 |
| WO | WO-2008-102453 | 8/2008 |

* cited by examiner

*Primary Examiner* — Khai M Nguyen
(74) *Attorney, Agent, or Firm* — Fujitsu Patent Center

(57) ABSTRACT

A semiconductor device includes a first switching device including a first electrode coupled with a first node, a second electrode coupled with a second node, and a first control electrode controlling connection between the first and second electrodes; a second switching device including a third electrode coupled with the second node, a fourth electrode coupled with the second node, and a second control electrode controlling the connection between the third electrode and the fourth electrode; and a first control circuit controlling a substrate voltage of the second switching device.

12 Claims, 14 Drawing Sheets

FIG. 12

SEMICONDUCTOR DEVICE

CROSS-REFERENCE TO RELATED APPLICATIONS

This application is based upon and claims the benefit of priority from the prior Japanese Patent Application No. 2008-291101, filed on Nov. 13, 2008, the entire contents of which is incorporated herein by reference.

FIELD

This invention relates to a semiconductor device.

BACKGROUND

In a switching circuit, for example, using MOS transistors, when each transistor is switched from ON state to OFF state, electric charge stored in a channel region of the transistor moves into a source region or a drain region due to a phenomenon known as clock leakage. Herein, "clock leakage" is assumed to include charge injection and clock feedthrough.

The clock leakage occurring when the MOS transistor varies from ON state to OFF state causes variations in the potential at a high-impedance node, for example, in a sample-and-hold circuit or a comparator circuit.

Charge injection is a phenomenon in which electric charge (electrons or holes) forming a channel when a transistor acting as a switching device is ON is moved into the source or drain of the transistor when the transistor is turned off. Clock feedthrough is a phenomenon in which, as the gate potential varies from a high level (H) to a low level (L), the potential is affected by an electrostatic effect arising from the parasitic capacitance between the gate and drain or between the gate and source when the transistor is an nMOS transistor, for example.

A semiconductor device is known which consists of a switching circuit having MOS transistors. The switching circuit has a main switching transistor and a canceling transistor having a channel width that is equal to half of the channel width of the main switching transistor.

In this semiconductor device, when the main switching transistor is turned from on to off, the effect of clock leakage is undone by performing an operation for switching the canceling transistor from off to on, i.e., the transistor is operated in a reverse-phase with respect to the switching operation of the main switching transistor.

FIGS. 1A and 1B are diagrams illustrating charge injection and a countermeasure against it. FIG. 1A illustrates the manner in which a main switching transistor 1 is varied from on to off. FIG. 1B illustrates the operation of a canceling transistor 2 when the main switching transistor 1 is varied from on to off. In FIGS. 1A and 1B, the main switching transistor 1 and canceling transistor 2 are nMOS transistors.

As illustrated in the left portion of FIG. 1A, the main switching transistor 1 has a gate G1. A high level signal H is applied to the gate G1, and the transistor conducts (ON). At this time, a channel CH1 is formed by electrons between source S1 and drain D1 opposite to the gate G1 within the substrate.

As illustrated in the right portion of FIG. 1A, when the high level signal H applied to the gate G1 goes low (L), the main switching transistor 1 varies from on to off. As a result, the channel CH1 disappears. Then, electric charge Qd forming the channel CH1 moves into the source 51 and drain D1 of the switching transistor 1. Electric charge Qd/2 flows into both the source and drain.

As illustrated in the left portion of FIG. 1B, when the main switching transistor 1 is ON, a low level signal L is applied to the gate G2 of the canceling transistor 2, turning the transistor off.

As illustrated in the right portion of FIG. 1B, when the main switching transistor 1 varies from on to off, the signal applied to the gate G2 of the canceling transistor 2 is switched from low level signal L to high level signal H. Consequently, a channel CH2 is formed between the source S2 and drain D2 opposite to the gate G2 of the canceling transistor 2 within the substrate, turning on the canceling transistor 2.

The canceling transistor 2 is half in size to the main switching transistor 1. The electric charge in the channel CH2 when the canceling transistor 2 is ON is half of the electric charge Qd in the channel CH1 when the main switching transistor 1 is ON.

The electrodes of the canceling transistor 2 are coupled with the source S1 or drain D1 of the main switching transistor 1. For example, the source S2 and drain D2 are shorted and coupled.

The electric charge (Qd/2) in the channel CH1 disappearing when the main switching transistor 1 varies from on to off is absorbed by the channel CH2 formed when the canceling transistor 2 varies from off to on. Thus, the effect of release of electric charge is canceled.

In FIGS. 1A and 1B, the main switching transistor 1 and canceling transistor 2 are nMOS transistors. They may also be pMOS transistors.

FIGS. 2A-2C illustrate a countermeasure against clock feedthrough. FIG. 2A illustrates the manner in which the main switching transistor 1 and the canceling transistor 2 are coupled.

FIG. 2B illustrates the statuses of the main switching transistor 1 and the canceling transistor 2 when the high level signal H is applied to the gate 1G and the main switching transistor 1 is ON.

FIG. 2C illustrates the statuses of the main switching transistor 1 and the canceling transistor 2 when the signal applied to the gate G1 is switched from high level H to low level L, turning off the main switching transistor 1.

Also, in FIGS. 2A to 2C, an nMOS transistor is illustrated as an example of each of the main switching transistor 1 and canceling transistor 2. The present invention is not limited to this configuration.

As illustrated in FIG. 2A, the source S2 and drain D2 of the canceling transistor 2 are shorted and coupled with the drain D1 of the main switching transistor 1.

The canceling transistor 2 is substantially half in gate width of the main switching transistor 1. A buffer amplifier that reshapes and outputs the waveform of the signal at the drain D1 of the main switching transistor 1 is indicated by reference numeral 3.

In the main switching transistor 1, the gate G1 and drain D1 are electrostatically coupled through the gate capacitance. Similarly, in the canceling transistor 2, the gate G2, source S2, and drain D2 are capacitively coupled through the gate capacitance. The drain D1 of the main switching transistor 1 is coupled with the source S2 and drain D2 of the canceling transistor 2.

When the main switching transistor 1 varies from ON state as illustrated in FIG. 2B to OFF state as illustrated in FIG. 2C, the canceling transistor 2 varies from off to on.

That is, the signal applied to the gate G2 of the canceling transistor 2 is switched from low level L to high level H, and variations in the potential due to electrostatic coupling of the main switching transistor 1 are absorbed by the electrostatic coupling of the canceling transistor 2.

There has been proposed a sample-and-hold circuit as a sampling switch, the circuit having at least two transistors. The opposite ends of the switch are coupled in parallel between a terminal to which an analog input voltage is applied and one end of a holding capacitor (Japanese Laid-open Patent Publication No. 11-224496).

In this sample-and-hold circuit, when the analog input voltage is sampled, one transistor of the at least two transistors is turned off and then the other transistor is turned off with a delay. Consequently, the sampling speed is increased. Also, the sampling accuracy is enhanced.

A circuit for adjusting the offset of an operational amplifier is also proposed, the circuit having a pair of MOS transistors for differential operation. The MOS transistors together form a differential amplifier. A voltage for setting an offset is applied to the substrate of the MOS transistors to calibrate the offset (Japanese Laid-open Patent Publication No. 11-068476).

The calibration of the offset is performed by applying the same voltage to the gates of the MOS transistors of a pair for differential operation and applying a voltage corresponding to the number of closed switches mounted in the MOS transistors to the substrate.

An analog signal processor used in an ADC realizing higher speeds and higher accuracy is also proposed (Japanese Laid-open Patent Publication No. 2002-033663).

The analog signal processor has a voltage selection portion for selecting a given reference voltage for comparison from a plurality of reference voltages for comparison and an arithmetic portion for arithmetically processing an analog input signal and the given reference voltage for comparison. Furthermore, the number of decision points is at least one more than the number of comparison reference voltages in the processor. In addition, the processor has a comparison portion to which the output from the arithmetic portion is applied and a coupling portion for controlling the coupling between the arithmetic portion and the comparison portion.

The arithmetic portions have correctable first signal processing portions. The number of the arithmetic portions is greater than the number necessary for the comparison reference voltages by at least M (where M is a natural number). The coupling portion couples the arithmetic portions having the first signal processing portions not engaged in corrective operation with the comparison portion when N (where N is a natural number; $N \leq M$) of the first signal processing portions are engaged in corrective operation.

This analog signal processor suppresses the number of devices by the use of interpolation and may correct an error produced in background by the interpolation. Furthermore, the processor may eliminate the effects of variations among the devices by a correction.

SUMMARY

According to one aspect of the invention, a semiconductor device includes a first switching device including a first electrode coupled with a first node, a second electrode coupled with a second node, and a first control electrode controlling connection between the first and second electrodes; a second switching device including a third electrode coupled with the second node, a fourth electrode coupled with the second node, and a second control electrode controlling the connection between the third electrode and the fourth electrode; and a first control circuit controlling a substrate voltage of the second switching device.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF THE DRAWINGS

FIG. 12 is a diagram illustrating one example of calibration operation of the fifth embodiment;

DESCRIPTION OF THE EMBODIMENTS

The relationships among the potential at the substrate of each MOS transistor, threshold voltage, and channel charge are described by referring to FIGS. 3A-3D.

Figure 1A:
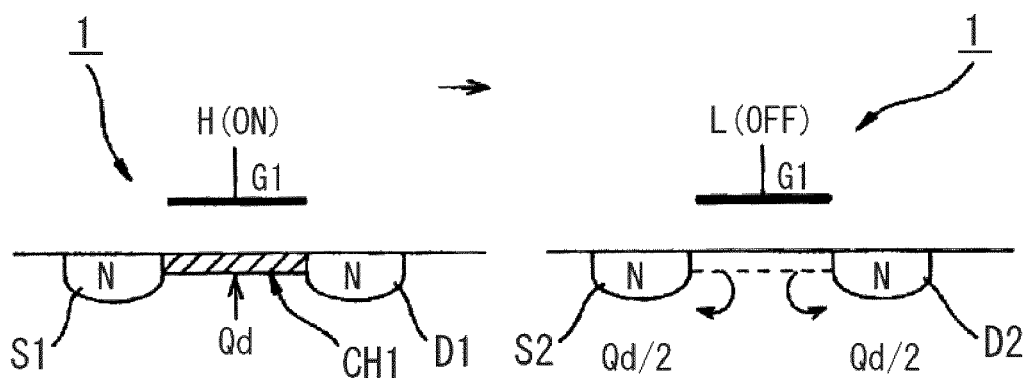
FIGS. 1A and 1B are diagrams illustrating a countermeasure against charge injection.
Figure 1B:
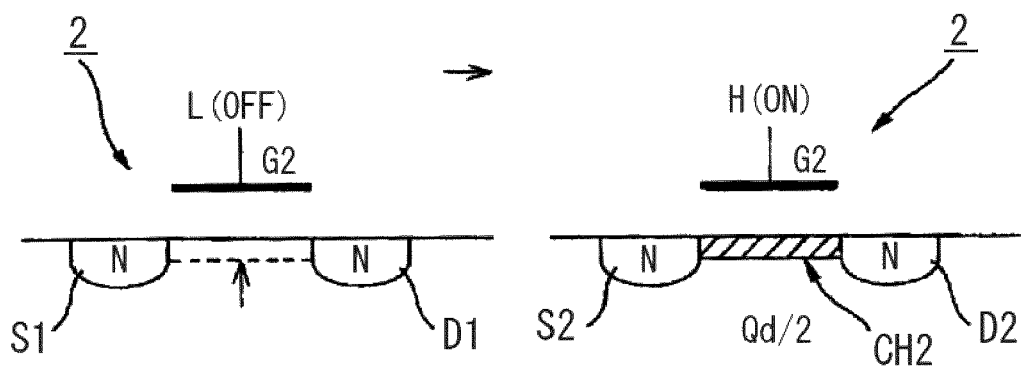
Figure 2A:
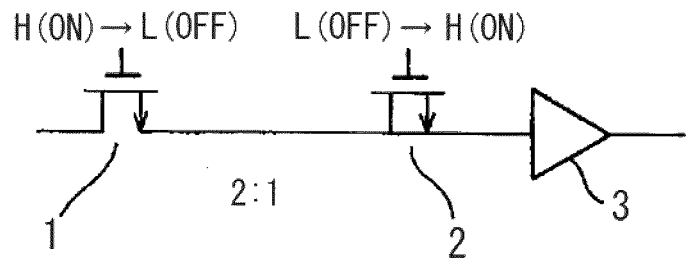
FIGS. 2A-2C are diagrams illustrating a countermeasure against clock feedthrough.
Figure 2B:
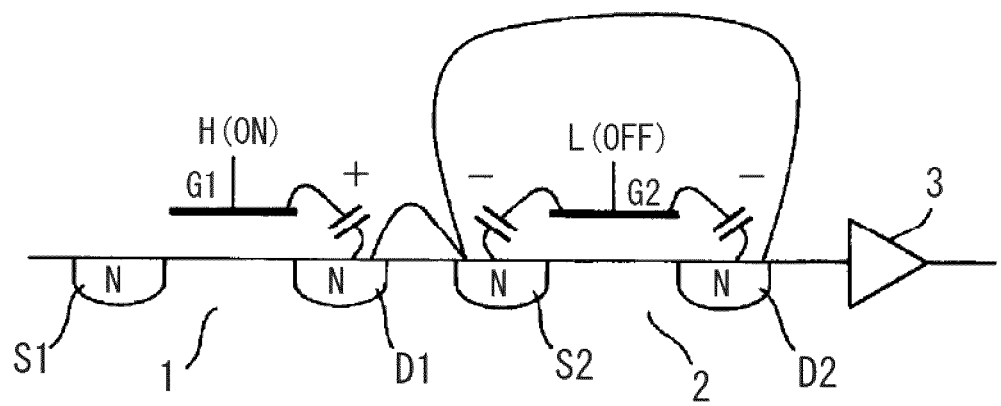
Figure 2C:
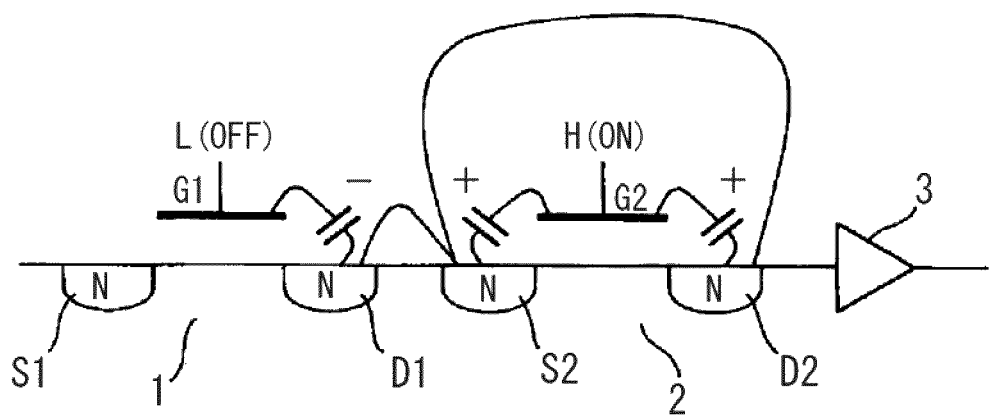
Figure 3A:
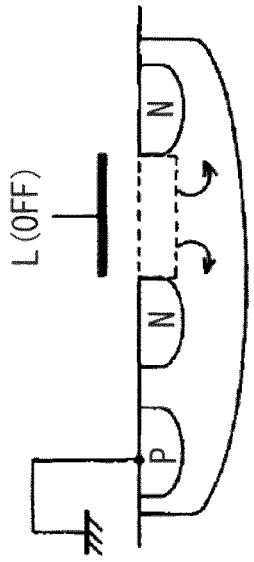
FIGS. 3A-3D are diagrams illustrating relationships among the potential at the substrate of each MOS transistor, threshold voltage, and channel charge.
Figure 3B:
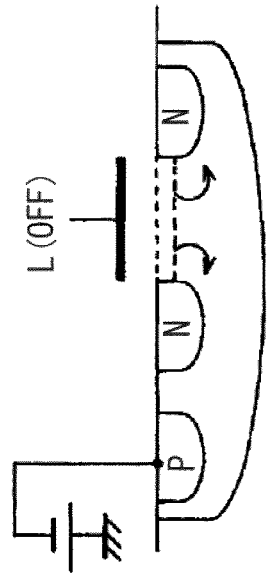
Figure 3C:
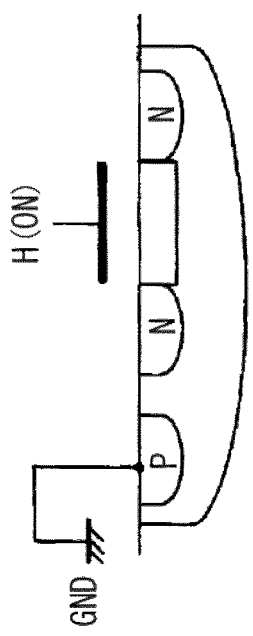
Figure 3D:
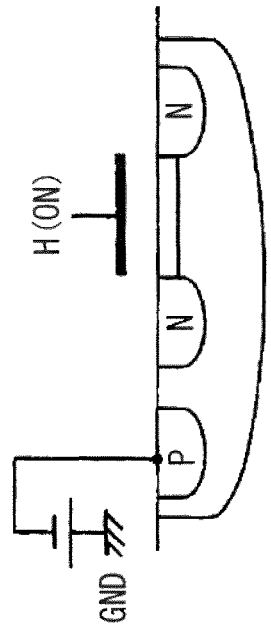

FIGS. 3A and 3B illustrate a case in which the substrate bias VBG is set at ground potential. FIGS. 3C and 3D illustrate a case in which the substrate bias VBG is set lower than ground potential.

FIGS. 3A and 3C illustrate a case in which a high level signal H is applied to the gate and thus the transistor is ON. FIGS. 3B and 3D illustrate a case in which the transistor has been turned off by varying the potential at the gate from high level H to low level L. In FIGS. 3A-3D, an nMOS transistor is illustrated as an example.

Channel charge Qd in the MOS transistor may be represented by Eq. (1). W indicates the gate width (channel width). L indicates the gate length. Cox indicates the thickness of a gate oxide film. Vgs indicates the gate-to-source voltage. Vth indicates a threshold voltage.

$$Qd = W \times L \times Cox \times (Vgs - Vth) \tag{1}$$

The channel charge Qd is in proportion to (Vgs−Vth). If the gate-to-source voltage Vgs is constant, the charge depends on the threshold voltage Vth.

Let γ be a substrate bias coefficient. The substrate bias effect is given by $$Vth = Vth0 + \gamma\{(|2\phi F + VSB|)^{1/2} - (|2\phi F|)^{1/2}\} \tag{2}$$

In the case of an nMOS, as the substrate bias VBG becomes lower, the threshold voltage Vth increases. In other words, if the gate-to-source voltage Vgs is constant, the channel charge Qd may be adjusted with the substrate bias VBG.

Figure 4A:
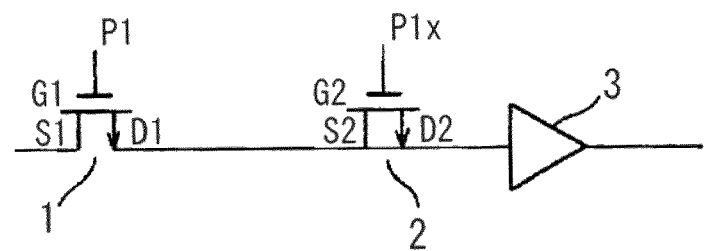
FIGS. 4A and 4B are diagrams illustrating the operation of one embodiment of the present invention.
Figure 4B:
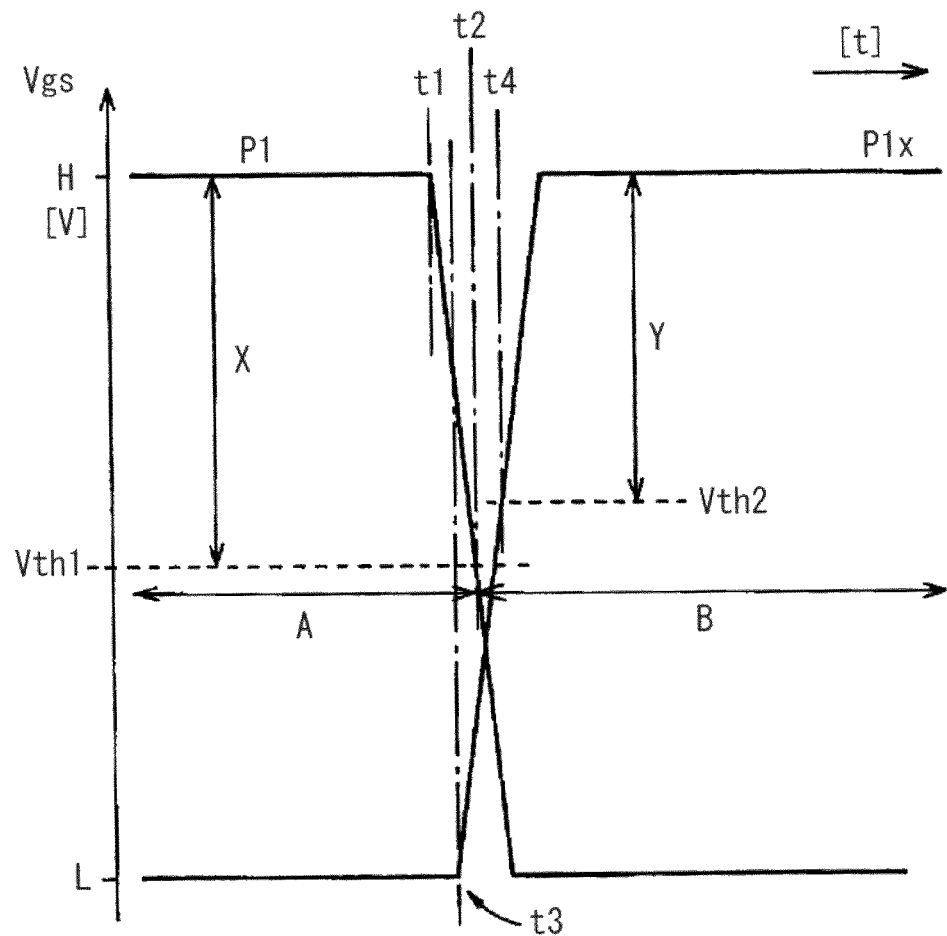

FIGS. 4A and 4B illustrate the operation of one embodiment of the invention. FIG. 4A illustrates how the main switching transistor 1 and the canceling transistor 2 are coupled. FIG. 4B illustrates the manner in which the gate-to-source voltage Vgs for each of the main switching transistor 1 and the canceling transistor 2 varies with time t.

As illustrated in FIG. 4A, the source S2 and drain D2 of the canceling transistor 2 are shorted to each other and coupled with the drain D1 of the main switching transistor 1. A buffer amplifier for reshaping the waveform of the signal from the drain D1 of the main switching transistor 1 and outputting the signal is indicated by reference numeral 3. A threshold voltage (gate-to-source voltage Vgs) for the main switching transistor 1 is indicated by reference symbol Vth1. A threshold voltage for the canceling transistor 2 is indicated by Vth2.

In FIG. 4B, during period A, the main switching transistor 1 is ON. During period B, the transistor 1 is OFF. In order to vary the transistor 1 from on to off, a control signal (gate voltage) P1 of high level H applied to the gate G1 starts to vary toward low level L at the timing t1.

The gate voltage P1 of the main switching transistor 1 gradually decreases from the timing t1 and reaches a potential equal to the threshold voltage Vth1 at timing t2. After the timing t2, the main switching transistor 1 is OFF.

At a timing t3 slightly later than the timing t2, the canceling transistor 2 is varied from off to on to absorb the electric charge produced when the main switching transistor 1 is switched from on to off.

That is, the control signal (gate voltage) P1x applied to the gate of the canceling transistor 2 starts to vary from low level L to high level H at the timing t2. Consequently, the gate voltage P1x of the canceling transistor 2 assumes a potential equal to the threshold voltage Vth2 at a timing t4. After the timing t4, the canceling transistor 2 is ON.

When the main switching transistor 1 is switched from on to off, the amount of electric charge released by the disappearance of the channel is the total amount of electric charge X obtained during the period in which the gate voltage P1 varies from the high level H to the threshold voltage Vth1. When the canceling transistor 2 is switched from off to on, the amount of electric charge absorbed by creation of a channel is the total amount of electric charge Y obtained during the period in which the gate voltage P1x varies from the threshold voltage Vth2 to the high level H.

Where the main switching transistor 1 and the canceling transistor 2 are operated as described previously, absorption of electric charge by the canceling transistor 2 effectively cancels variations in potential after the timing t2 at which the main switching transistor 1 is turned off. Prior to the timing t2, the main switching transistor 1 is in conduction and so no electric charge is retained. The effect of canceling variations in the potential is not produced.

Accordingly, electric charge is actually absorbed after the timing t2 at which the gate voltage P1 of the main switching transistor 1 becomes lower than the threshold voltage Vth1 and after the timing t4 at which the gate voltage P1x at the gate G2 of the canceling transistor 2 becomes higher than the threshold voltage Vth2.

As described previously, with respect to the charge injection, a channel is formed in the substrate in an opposite relation to the gate G1 when the main switching transistor 1 is ON. The amount of electric charge Qd is indicated by $Qd = W \times L \times Cox \times (Vgs - Vth)$.

The total amounts of electric charge in channels of the main switching transistor 1 and the canceling transistor 2 may be controlled by varying the substrate bias VBG, which is the backgate voltage of the transistor, so as to vary the threshold voltages Vth1 and Vth2.

In the description provided so far, the canceling transistor 2 is mounted only on the side of the drain D1 of the main switching transistor 1. The canceling transistor may also be mounted on the side of the source S1 of the main switching transistor 1. In this case, when the main switching transistor 1 varies from on to off, electric charge is absorbed by the two canceling transistors mounted at the drain D1 and source S1, respectively, of the main switching transistor 1.

Figure 5A:
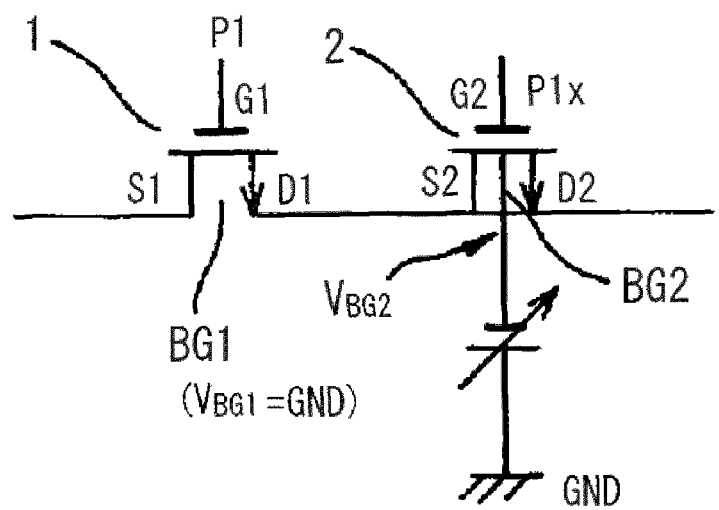
FIGS. 5A and 5B are diagrams illustrating a first embodiment of the invention.
Figure 5B:
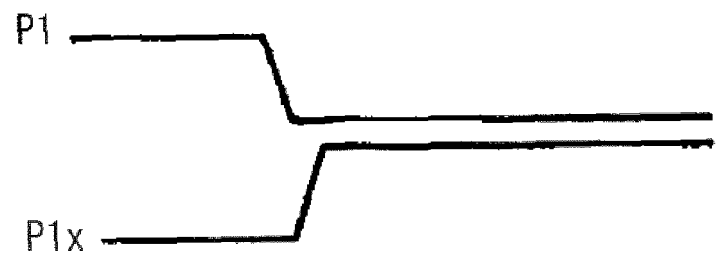

FIGS. 5A and 5B illustrate a first embodiment of the present invention. FIG. 5A is a circuit diagram. FIG. 5B is a timing diagram.

As illustrated in FIG. 5A, the source S2 and drain D2 of the canceling transistor 2 are shorted to each other and coupled with the drain D1 of the main switching transistor 1. A substrate bias VBG2 that is a potential lower than ground potential GND is applied to the backgate BG2 of the canceling transistor 2.

A substrate bias VBG1 that is the ground potential GND is applied to the backgate BG2 of the main switching transistor 1.

As illustrated in FIG. 5B, after the gate voltage P1 of the main switching transistor 1 varies from high level H to low level L, the gate voltage P2 of the canceling transistor 2 varies from low level L to high level H.

Electric charge released when the main switching transistor 1 is turned off is absorbed by the canceling transistor 2.

The gate width of the canceling transistor 2 is about half of the gate width of the main switching transistor 1.

The accuracy of compensation is improved by controlling the amount of electric charge absorbed by variation from off to on of the canceling transistor 2 with the substrate bias VBG2 applied to the backgate BG2. That is, the amount of electric charge released by variation from on to off of the main switching transistor 1 is brought into coincidence with the amount of electric charge absorbed by the canceling transistor 2 from off to on.

The size of the canceling transistor 2 does not always need to be about half the size of the main switching transistor 1. In particular, the transistor size may be reduced, for example, by lowering the substrate bias VBG2 of the canceling transistor 2 to increase the amount of electric charge absorbed by variation of the canceling transistor 2 from off to on.

In FIG. 5A, the source S2 and drain D2 of the canceling transistor 2 are shorted and coupled with the node on the side of the drain D1 of the main switching transistor 1. Alternatively, they may be coupled with the node on the side of the source S1 as illustrated in FIG. 7.

Figure 7:
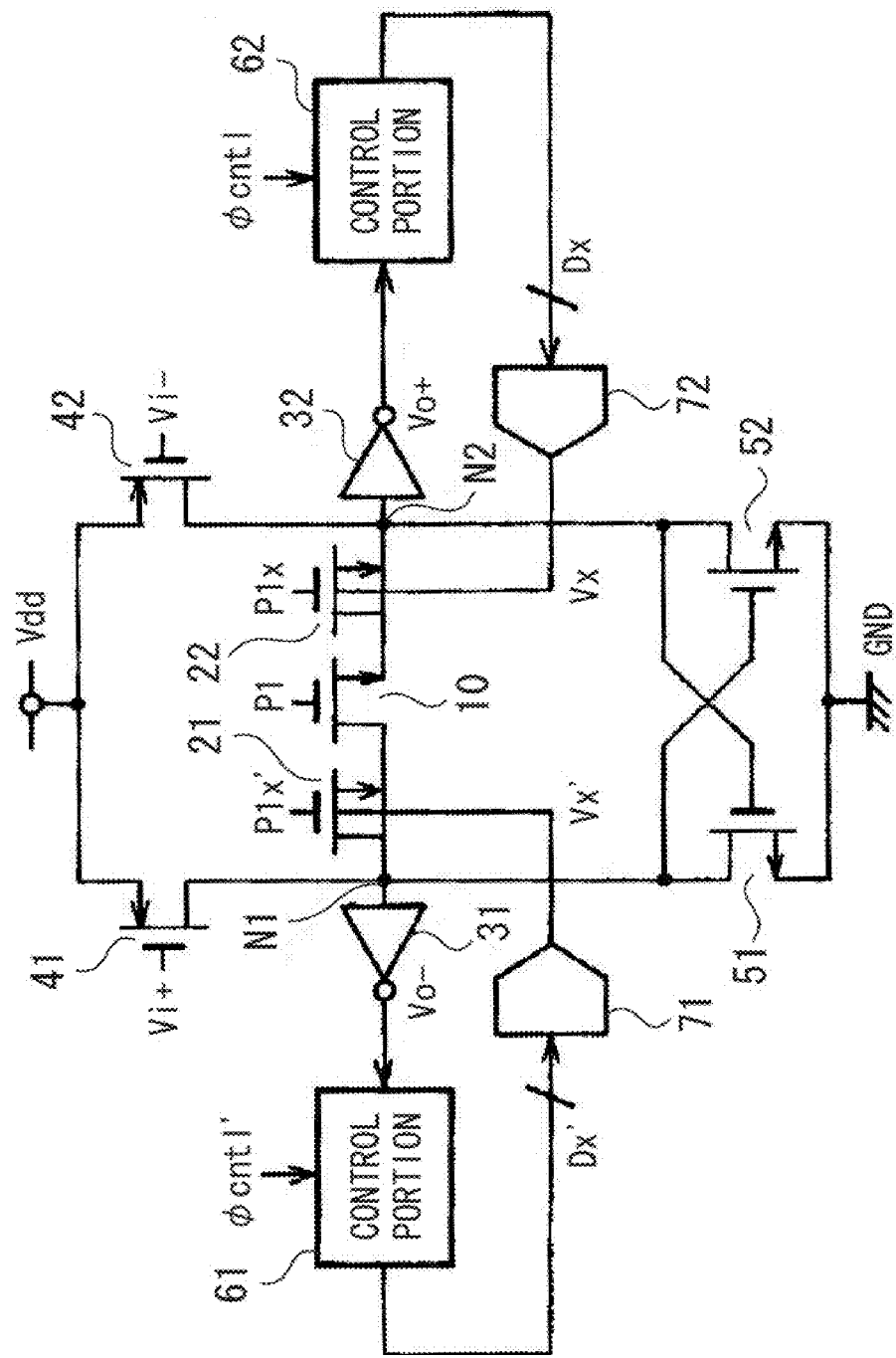
FIG. 7 is a circuit diagram of a third embodiment of the invention.

As illustrated in FIG. 7, canceling transistors 21 and 22 may be mounted at nodes on the sides of the source S1 and drain D1, respectively, of the main switching transistor 1. Substrate biases of the canceling transistors 21 and 22 Vx' and Vx may be controlled. After the main switching transistor 1 is varied from on to off, the canceling transistors 21 and 22 are varied from off to on at the same timing.

Figure 6A:
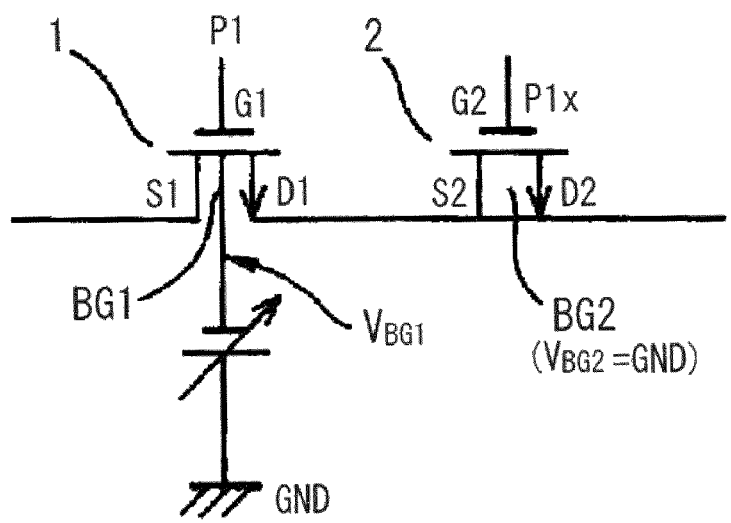
FIGS. 6A and 6B are diagrams illustrating a second embodiment of the invention.
Figure 6B:
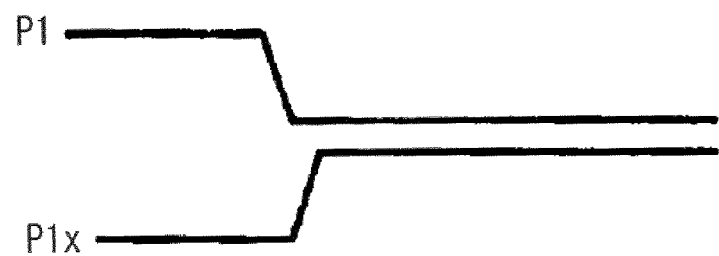

FIGS. 6A and 6B illustrate a second embodiment of the present invention. FIG. 6A is a circuit diagram. FIG. 6B is a timing diagram.

In the second embodiment, a substrate bias VBG1 that is a potential lower than the ground potential GND is applied to the backgate BG2 of the main switching transistor 1. A substrate bias VBG2 that is at the ground potential GND is applied to the backgate BG2 of the canceling transistor 2.

As illustrated in FIG. 6B, after the gate voltage P1 of the main switching transistor 1 varies from high level H to low level L, and the gate voltage P2 of the canceling transistor 2 varies from low level L to high level H.

Consequently, the electric charge released when the main switching transistor 1 varies from on to off is absorbed by the canceling transistor 2. The amount of electric charge released by the main switching transistor 1 is controlled by the substrate bias VBG1 applied to its backgate BG1.

FIG. 7 illustrates a third embodiment of the invention. In this embodiment, the present invention is applied to a positive feedback type latch comparator.

As illustrated in FIG. 7, the positive feedback type latch comparator of the third embodiment has pMOS transistors 41, 42, nMOS transistors 21, 10, 22, 51, 52, an inverter 31, control portions 61 and 62, and D/A converters 71 and 72.

The sources of the pMOS transistors 41 and 42 are coupled with a high-potential power line Vdd. Complementary input signals Vi+ and Vi− are supplied to the gates of the pMOS transistors 41 and 42, respectively.

The sources of the nMOS transistors 51 and 52 are coupled with a grounding line GND. The drains and gates of the nMOS transistors 51 and 52 are cross-coupled.

The inverters 31 and 32 are coupled with common coupling nodes N1 and N2 between the drains of the pMOS transistors 41 and 42 and the drains of the nMOS transistors 51 and 52, and deliver latched, complementary output signals $Vo^-$ and $Vo^+$, respectively.

The nMOS transistors 21, 10, and 22 are coupled in series between the common-coupling nodes N1 and N2. The transistor 10 corresponds to the main switching transistor 1, while the transistors 21 and 22 correspond to the canceling transistor 2.

A main switching transistor 10 is a resetting switch for positive feedback latching. Electric charge produced when the reset switch 10 varies from on to off is absorbed into the canceling transistors 21 and 22 coupled on the opposite sides of the main switching transistor 10 by controlling the canceling transistors 21 and 22.

The substrate biases Vx' and Vx are applied to the backgates of the canceling transistors 21 and 22, respectively. The substrate biases Vx' and Vx are output from the D/A converters 71 and 72, respectively, according to digital signals Dx' and Dx, which in turn are output from the control portions 61 and 62 controlled by control signals φcontrl' and φcontrl, respectively.

The amount of absorption of charge injection that is electric charge produced when the reset switch 10 varies from on to off is adjusted by controlling the threshold voltages for the canceling transistors 21 and 22 by adjusting the substrate biases Vx' and Vx.

Figure 8:
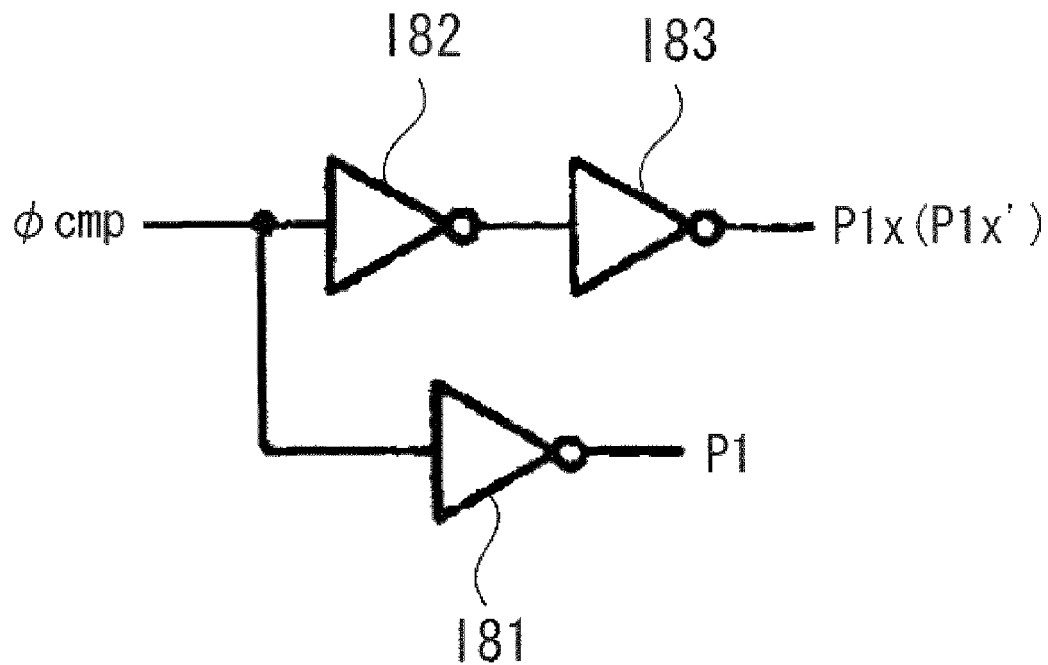
FIG. 8 is a diagram of one example of a circuit for producing control signals for a main switching circuit and a canceling transistor included in the circuit of the third embodiment.

FIG. 8 illustrates one example of a circuit for creating control signals for the main switching transistor and canceling transistors of FIG. 7.

As illustrated in FIG. 8, the control signal P1 applied to the gate of the reset switch 10 and control signals P1x and P1x' applied to the gates of the canceling transistors 22 and 21 are created by three inverters I81-I83, respectively, controlled by a comparison control signal φcmp.

The control signal P1x or P1x' for the canceling transistors 22 or 21 are signals delayed with a logic reverse to the control signal P1 for the reset switch 10. After the reset switch 10 varies from on to off and electric charge is released, the canceling transistor 22 or 21 varies from off to on and the released electric charge is absorbed.

If the comparator output is 1 (H), for example, the control portion 62 or 61 of the positive feedback type latch comparator illustrated in FIG. 7 increases the digital value Dx or Dx' given to the D/A converter 72 or 71.

Consequently, the output voltage (of a positive logic, for example) of the D/A converter 72 or 71 increases, thus increasing the substrate bias that is the backgate voltage of the canceling transistor 22 or 21 controlled by the control signal P1x or P1x'.

As a result, the threshold voltage Vth2 for the canceling transistor 22 or 21 decreases and the amount of absorbed charge increases. The amount of absorbed negative charge increases. Consequently, the voltage at the node N2 or N1 rises. These operations are repeated. Finally, the comparator converges at a point where the result of a decision is repeated alternately between 1 and 0. As a result, the offset is canceled.

Information obtained when the offset is canceled is stored, for example, in registers installed in the control portions 61 and 62, a nonvolatile memory, or the like and used. Various known circuit configurations and processing sequences may be employed for the configuration of the control portions.

Figure 9:
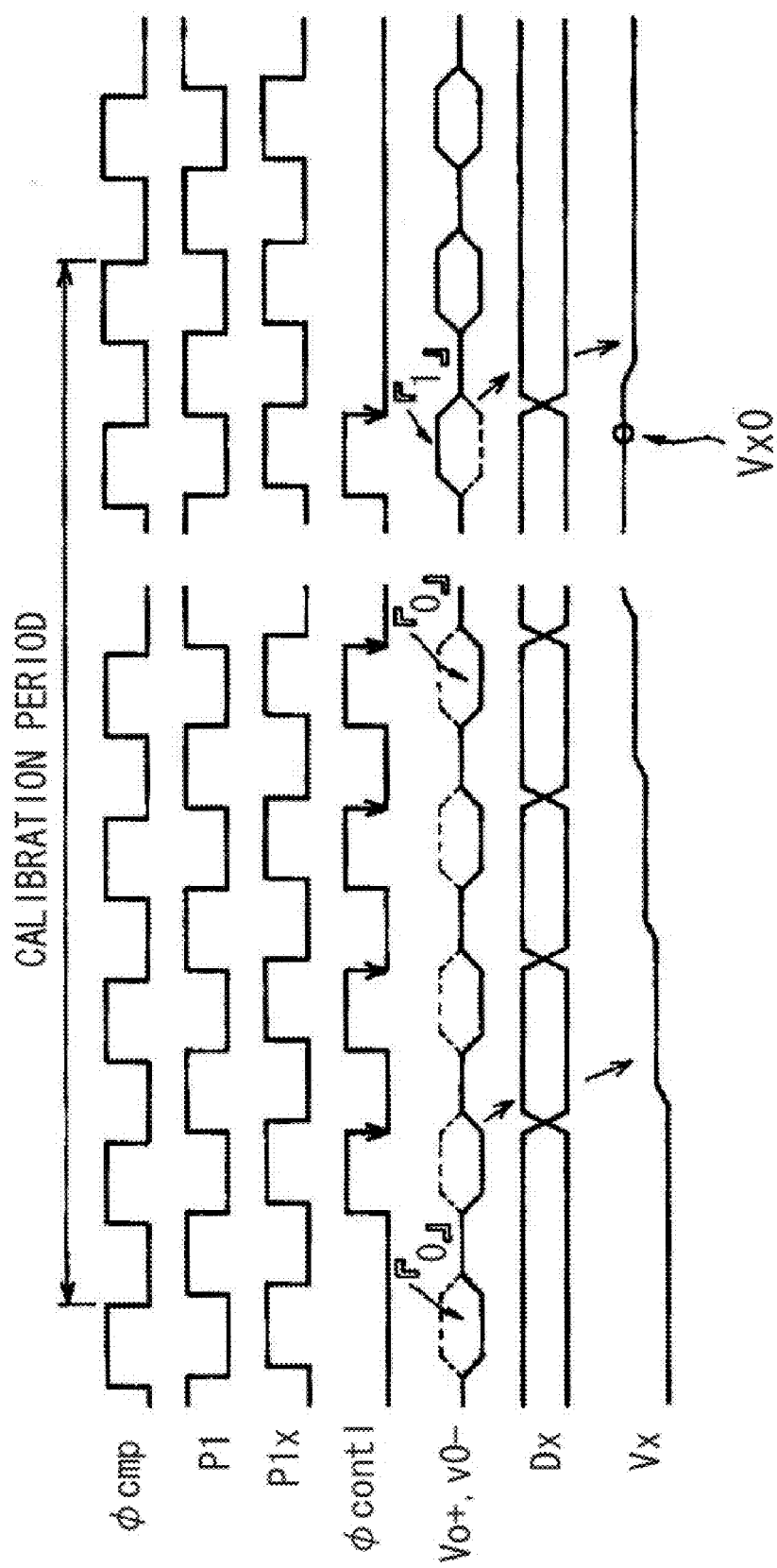
FIG. 9 is a timing diagram of the circuit of the third embodiment.

FIG. 9 is a timing diagram illustrating signals illustrated in FIG. 7. FIG. 9 illustrates an example in which a calibration period is set.

As illustrated in FIG. 9, the control signal P1 for the reset switch 10 is obtained by inverting the comparison control signal φcmp with the inverter I81. The control signal P1x for the canceling transistor 22 is a signal obtained by delaying the comparison control signal φcmp by the two stages of inverters I82 and I83.

The control portion 62 is controlled by the control signal φcontl and outputs the digital signal Dx to the D/A converter 72. The D/A converter 72 applies the output voltage Vx corresponding to the digital signal Dx to the backgate of the canceling transistor 22.

In a calibration process, the control portion 62 accepts the output from the comparator in response to the control signal φcontl, i.e., the output signal Vo+ from the inverter 32, and detects the timing at which the output signal Vo+ is inverted from 0 to 1.

The control portion 62 retains a digital value Dx occurring at an timing preceding the timing at which the signal Vo+ is inverted from 0 to 1 by one clock interval and terminates the calibration process. The D/A converter 72 applies the voltage Vx corresponding to the digital value Dx retained in the control portion 62 to the backgate of the canceling transistor 22. The digital value Dx retained in the control portion 62 may be a digital value Dx occurring at the timing when the signal Vo+ is inverted from 0 to 1.

For example, the above-described processing may be performed as an initialization procedure performed when the power supply of an apparatus, for example, incorporating a positive feedback type latch comparator is turned on. The processing is not limited to this procedure. The digital value Dx retained in the control portion 62 may be set, for example, either by a background task performed when the apparatus incorporating the comparator is used in practice or by an operation performed when an LSI or apparatus incorporating the comparator is shipped.

Figure 10:
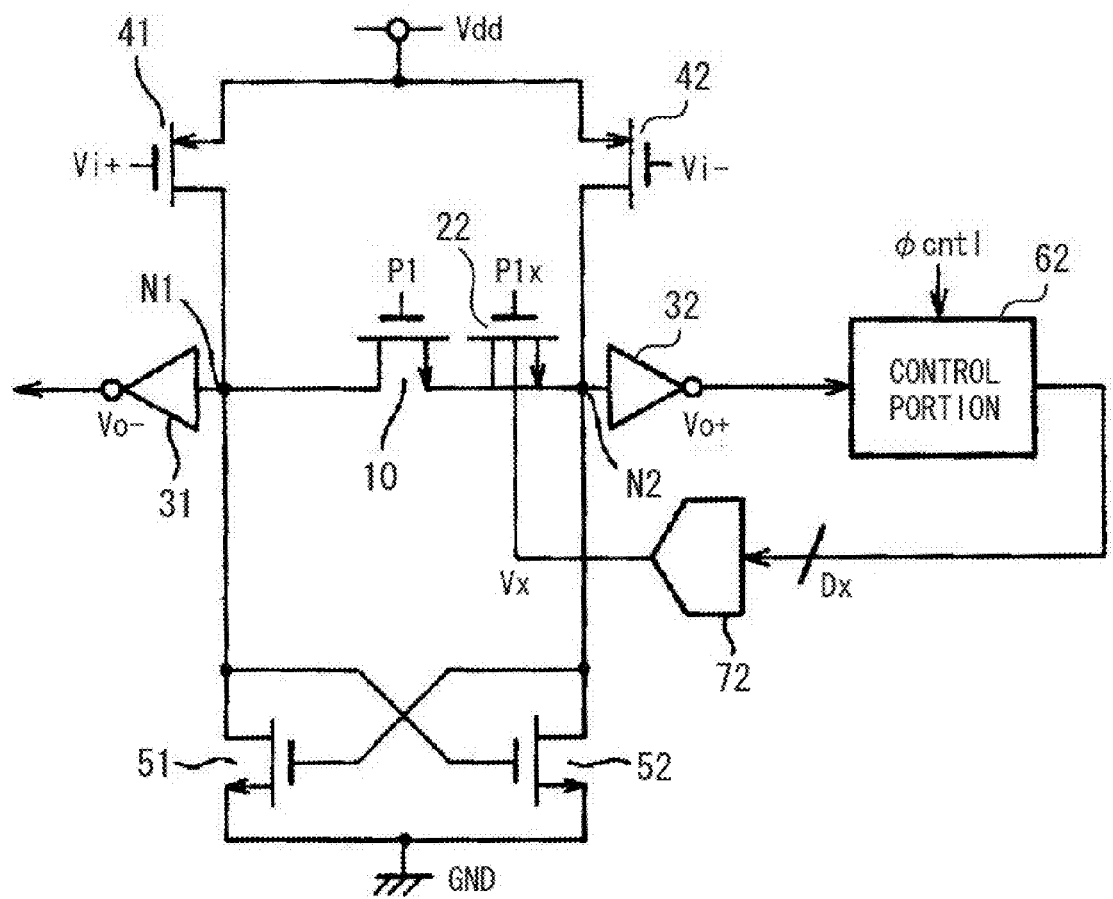
FIG. 10 is a circuit diagram of a fourth embodiment of the invention.

FIG. 10 illustrates a fourth embodiment of the invention which is similar to the positive feedback type latch comparator of FIG. 7 from which the control portion 61, D/A converter 71, and canceling transistor 21 have been removed.

In the comparator illustrated in FIG. 10, electric charge released when the canceling transistor 2 varies from on to off is absorbed by the canceling transistor 22 mounted on the side of the drain of the canceling transistor 2.

Where the canceling transistor 22 is mounted only on the side of the drain of the canceling transistor 2 as in the fourth embodiment, it is possible to make compensation of the effect of clock leakage by performing the calibration process described in coupling with FIG. 9.

The comparators illustrated in FIGS. 7 and 10 may be applied to an analog signal processor, for example, disclosed in WO/2008/102453 pamphlet.

Figure 11:
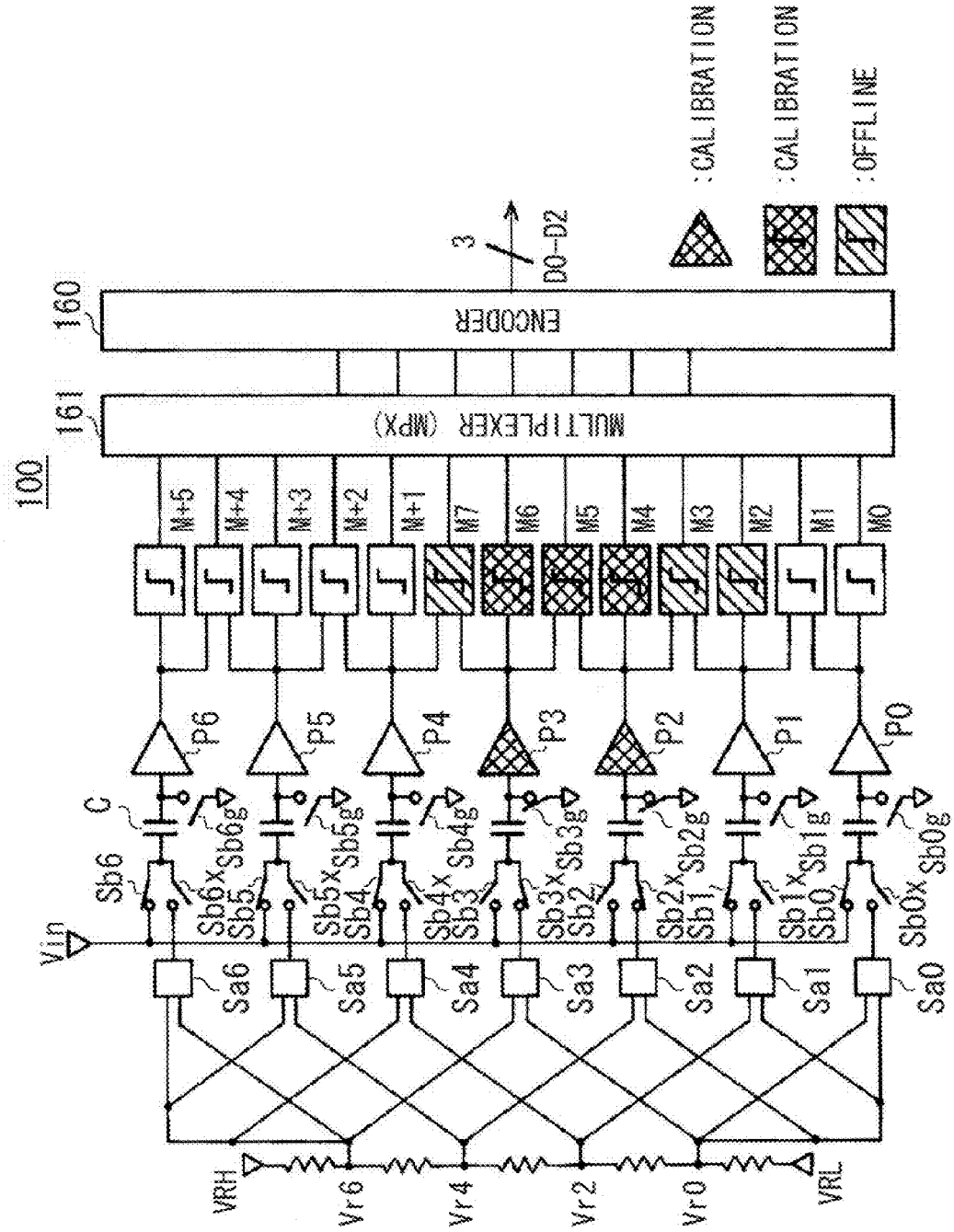
FIG. 11 is a circuit diagram of a fifth embodiment of the invention.

FIG. 11 illustrates a fifth embodiment of the invention. This is an example of a fully parallel A/D converter for performing a calibration process in background as disclosed in patent document 3. The A/D converter 100 illustrated in FIG. 11 is made of a single-ended configuration and converts the analog input signal Vin into a digital signal of 3 bits D0-D2.

In FIG. 11, reference symbols Sa0, Sa1, . . . , Sa6 indicate switches, which select and output comparison reference voltages Vr0, Vr2, . . . , Vr6 obtained by dividing a range of voltages between voltages VRH and VRL.

Each of capacitors respectively coupled with preamplifiers P0-P6 (Pi) has a capacitance of C. During normal operation, analog input signals Vin are supplied to the capacitors via switches Sb0-Sb6 (Sbi). During calibration, comparison reference voltages Vref are supplied via switches Sb0x to Sb6x (Sbix).

During calibration, the capacitors are charged with electric charge of C(Vref-GND) by placing the coupling nodes between the capacitors and the preamplifiers Pi at ground potential GND using switches Sbig. Then, the coupling nodes between the capacitors and the preamplifiers Pi are disconnected from earth ground by opening the switches Sbig. The electric charge (e.g., comparison reference voltage Vref) is retained in the capacitors.

During the calibration, the preamplifiers Pi amplify the ground potential GND and supply the amplified potential to latch circuits M0-M7 and M+1 to M+5 (Mi). The latch circuits perform offset cancellations based on the input values. Thus, the outputs from the preamplifiers produced when the ground potential is input are set as threshold voltages.

As an example, a comparator illustrated in FIG. 7 or 10 may be used as each latch circuit Mi. For instance, the comparator illustrated in FIG. 7 or 10 is used as latches M1, M3, M5, M7, M+2, and M+4. The comparator illustrated in FIG. 7 or 10 is used as latches M0, M2, M4, M6, M+1, M+3, and M+4, and input signal Vi+ and output signal Vo+ are used, for example. A reference voltage is applied as an input signal Vi−.

FIG. 11 illustrates the state in which a calibration operation is performed using the preamplifiers P2 and P3 and the latches M4-M6. The latches M2, M3, and M7 are offline (i.e., not used).

In FIG. 11, reference numeral 161 indicates a multiplexer MPX for controlling the coupling between each latch circuit Mi and the input of an encoder 160. The output signal from the latch Mi is selected and output from the multiplexer 161. The encoder 160 encodes the output signal and outputs a digital signal of 3-bits D0-D2.

Figure 12:
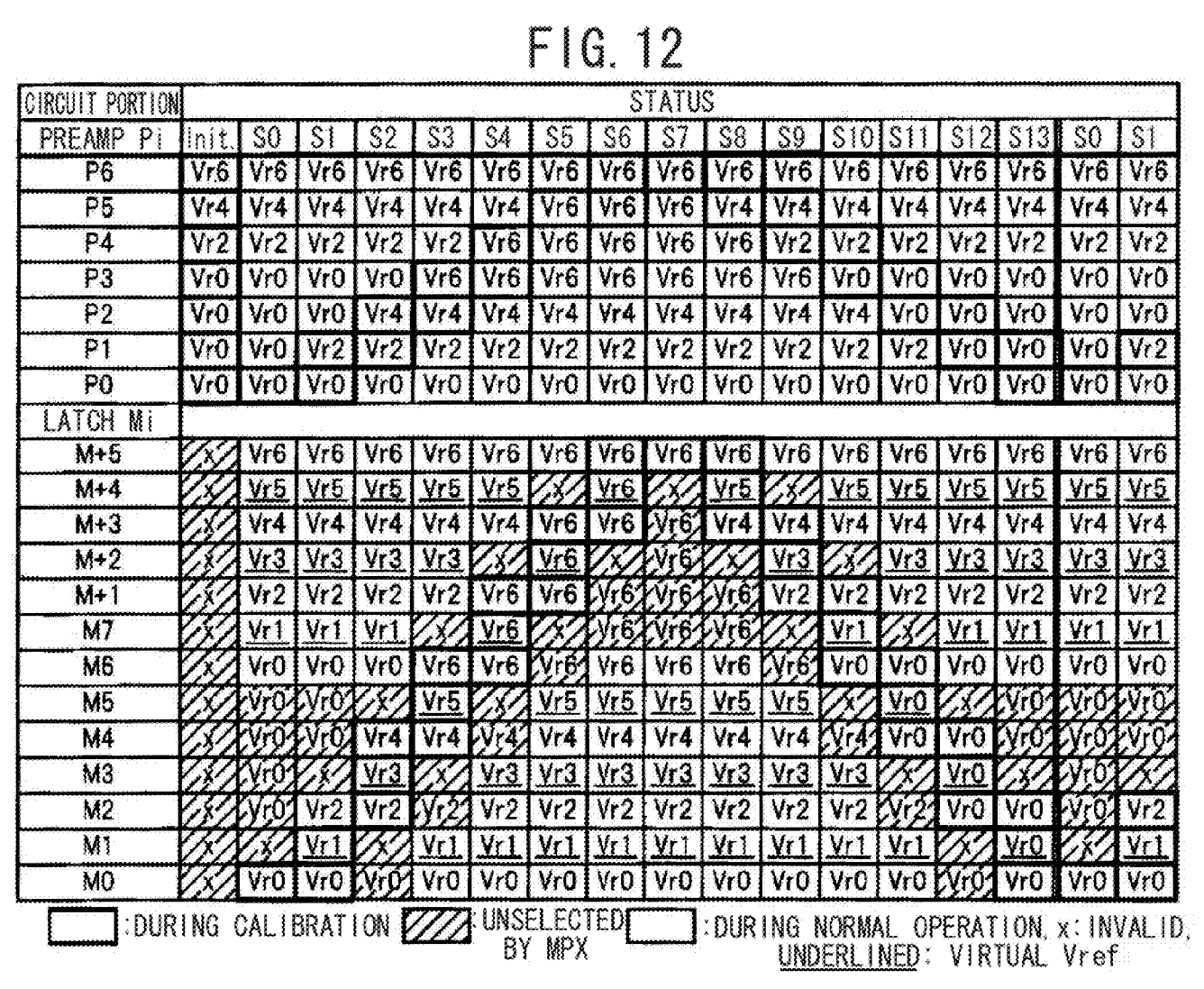

FIG. 12 illustrates one example of the calibration operation of FIG. 11. FIG. 12 illustrates comparison reference voltages Vr0-Vr6 applied to the preamplifiers Pi, the statuses of the preamplifiers P0-P6, and decision points of the latches Mi.

In FIG. 12, cells surrounded by the bold frame indicate that a calibration operation is being carried out. Hatched cells indicate portions not selected by the multiplexer 161. The other framed cells indicate that a normal operation is being carried out. "x" indicates invalidity. Underlined cells indicate virtual comparison reference voltages Vref. The A/D converter illustrated in FIG. 11 performs an operation by repeatedly creating 14 statuses of S0-S13.

The status of the A/D converter illustrated in FIG. 11 corresponds to the status S3 of FIG. 12. The preamplifiers P2, P3 and latches M4-M6 are engaged in a calibration operation. The latch circuits M2, M3, and M7 are offline and not selected by the multiplexer 161. At this time, the comparison reference voltage supplied to the latch circuits M3 and M7 is disabled. A virtual comparison reference voltage Vr5 is supplied to the latch circuit M5 from the reference voltages Vr4 and Vr6.

For example, the latch circuits M4-M6 performing a calibration operation in the status S3 carry out a calibration operation as already described with reference to FIG. 9 to make a compensation of the effect of clock leakage in the latch circuits M4-M6. The calibration operation in the latch circuits is performed in succession by the latch circuits that perform calibration in the successively shifted statuses S0-S13.

Figure 13:
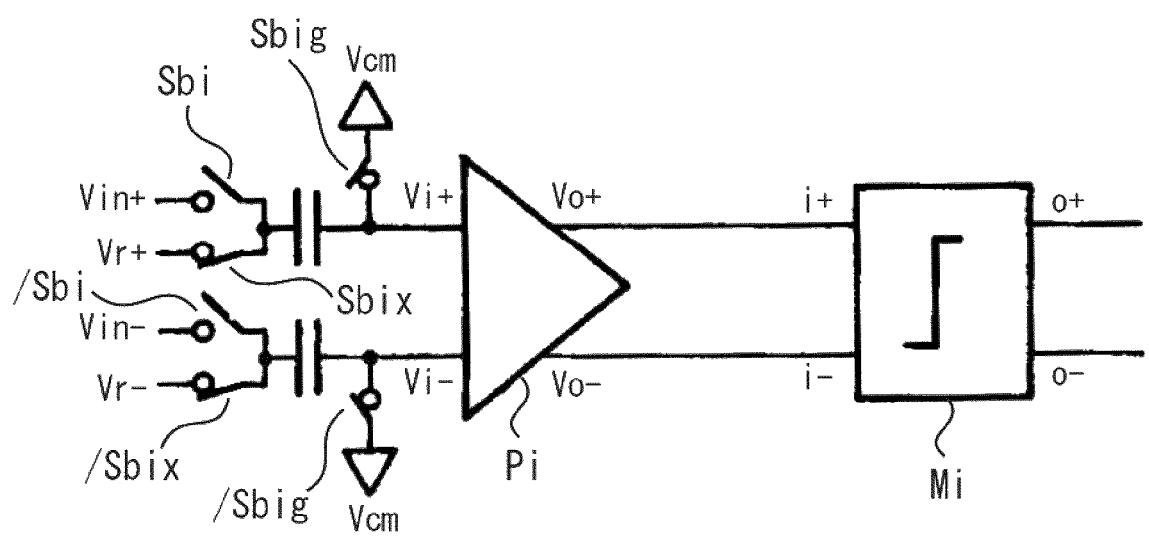
FIG. 13 is a circuit diagram illustrating the fifth embodiment.

FIG. 13 illustrates a fifth embodiment of the invention, and depicts connective relationships among the preamplifiers and latches in a fully parallel A/D converter having a differential circuit. Preamplifiers Pi and latch circuits Mi illustrated in FIG. 13 are differential circuit versions of the single-ended preamplifiers P0-P6 and latch circuits M0-M7, M+1-M+5 in the fully parallel A/D converter illustrated in FIG. 11.

The differential input signals Vi+ and Vi− and differential output signals Vo+ and Vo− of the comparator illustrated in FIGS. 7 and 10 correspond to the differential input signals i+ and i− and differential output signals o+ and o− of each latch Mi of FIG. 13.

In FIG. 13, in a case where the preamplifiers Pi and latches Mi are configured as a differential circuit, a switch and a capacitor are coupled to the differential inputs of each preamplifier Pi in the same way as the single-ended circuit of FIG. 11.

Capacitors and switches Sbi, Sbix, and Sbig are coupled to positive-logic inputs of the preamplifiers Pi. Capacitors and switches /Sbi, /Sbix, and /Sbig are coupled to negative-logic inputs.

In the calibration operation, the two sets of switches Sbi, /Sbi; Sbix, /Sbix and Sbig, /Sbig are switched in response to the operations of the switches Sbi, Sbix, and Sbig in the single-ended circuit.

Figure 14:
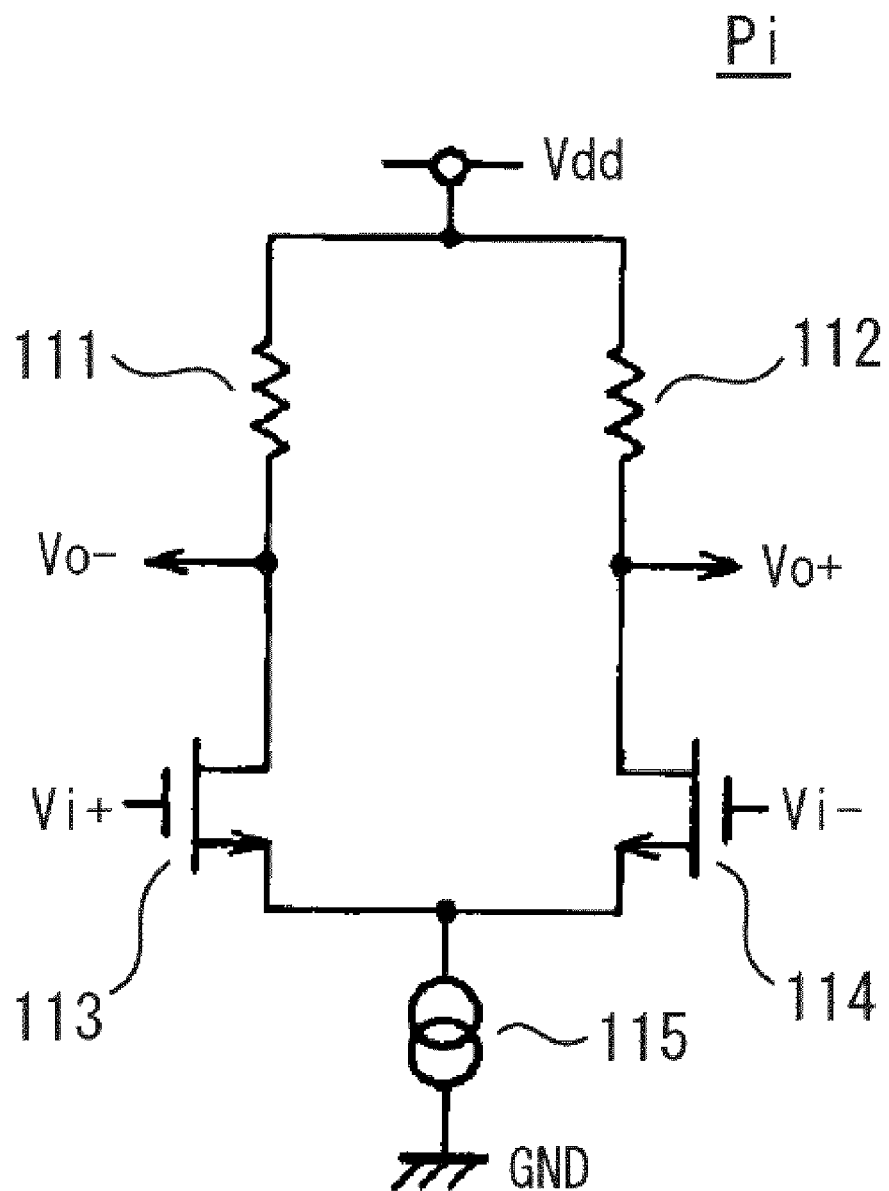
FIG. 14 is a circuit diagram of one example of a preamplifier used in the circuit of FIG. 13 according to the fifth embodiment.

FIG. 14 illustrates one example of a differential amplifier that is a preamplifier in the fifth embodiment of FIG. 13.

In FIG. 14, each preamplifier Pi is a differential amplifier and has load resistors 111 and 112, a pair of differential transistors 113 and 114, and a current source 115. The differential transistors 113 and 114 have gates to which differential inputs Vi+ and Vi− are applied. Differential outputs Vo− and Vo+ are taken from a coupling node between the load resistor 111 and the transistor 113 and from a coupling node between the load resistor 112 and the transistor 114, respectively, and supplied to the inputs of the differential latches Mi in the following stage.

For example, the positive feedback type latch comparator illustrated in FIG. 7 or 10 may be used as each differential amplifier Mi. As an example, the calibration operation described in coupling with FIG. 9 may also be performed in the background.

The present embodiment pertains to a semiconductor device that absorbs the effect of clock leakage of a main switching device by means of canceling devices. The principle of this semiconductor device is not limited to the latch comparator and A/D converters of the above-described embodiment but may be applied to a wide variety of semiconductor devices.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A semiconductor device comprising:
   a first switching device including a first electrode coupled with a first node, a second electrode coupled with a second node, and a first control electrode controlling connection between the first and second electrodes;
   a second switching device including a third electrode coupled with the second node, a fourth electrode coupled with the second node, and a second control electrode controlling the connection between the third electrode and the fourth electrode; and
   a first control circuit controlling a substrate voltage of the second switching device.

2. A semiconductor device according to claim 1, wherein after the first switching device is switched from ON-state to OFF-state, the second switching device is switched from OFF-state to ON-state.

3. A semiconductor device according to claim 1,
   wherein the first switching device is a first MOS transistor,
   wherein the second switching device is a second MOS transistor, and
   wherein the gate width of the second MOS transistor is half the gate width of the first MOS transistor.

4. A semiconductor device according to claim 1, wherein the second switching device absorbs electric charge released from the first switching device when the first switching device switches from ON-state to OFF-state.

5. A semiconductor device according to claim 1, further comprising a third switching device including a fifth electrode coupled with the first node, a sixth electrode coupled with the first node, and a third control electrode controlling connection between the fifth electrode and the sixth electrode.

6. A semiconductor device according to claim 5, wherein after the first switching device is switched from ON-state to OFF-state, the third switching device is switched from OFF-state to ON-state.

7. A comparator circuit comprising:
   a first transistor of a first conductivity type including a first source coupled with a first power supply line, a first gate receiving a first input signal, and a first drain;
   a second transistor of the first conductivity type including a second source coupled with the first power supply line, a second gate receiving a second input signal, and a second drain;
   a third transistor of a second conductivity type including a third source coupled with a second power supply line, a third gate coupled with the second drain, and a third drain coupled with the first drain;
   a fourth transistor of the second conductivity type including a fourth source coupled with the second power supply line, a fourth gate coupled with the first drain, and a fourth drain coupled with the second drain;
   a first switching device including a first electrode coupled with the first drain, a second electrode coupled with the second drain, and a first control electrode for controlling connection between the first electrode and the second electrode;
   a second switching device including a third electrode coupled with the second drain, a fourth electrode coupled with the second drain, and a second control electrode for controlling connection between the third electrode and the fourth electrode; and
   a first control circuit controlling a substrate voltage of the second switching device.

8. A comparator circuit according to claim 7, wherein the first control circuit receives an output signal from the second drain, and controls the substrate voltage of the second switching device to absorb, when the second switching device varies from OFF-state to ON-state, electric charge released when the first switching device varies from ON-state to OFF-state.

9. An analog-to-digital converter comprising:
   a voltage selection circuit selecting a comparison reference voltage from a plurality of comparison reference voltages;
   an arithmetic circuit arithmetically processing the comparison reference voltage and an analog input signal;
   a comparison circuit to which an output from the arithmetic portion is applied, the comparison circuit including at least one comparator circuit according to claim 7; and
   a coupling circuit controlling coupling between the arithmetic circuit and the comparison circuit.

10. An analog-to-digital converter according to claim 9,
    wherein the comparison circuit includes a plurality of comparator circuits,
    wherein the plurality of comparator circuits include first comparator circuits belonging to a first group and second comparator circuits belonging to a second group,
    wherein the first comparator circuits perform comparisons and decisions in response to a signal from the arithmetic circuit, and
    wherein the second comparator circuits perform a calibration operation.

11. A semiconductor device comprising:
    a first switching device including a first electrode coupled with a first node, a second electrode coupled with a second node, and a first control electrode for controlling the coupling between the first and second electrodes;
    a second switching device including a third electrode coupled with the second node, a fourth electrode coupled with the second node, and a second control electrode controlling connection between the third electrode and the fourth electrode; and
    a control circuit controlling a substrate voltage of the first switching device.

12. A semiconductor device according to claim 11, wherein after the first switching device is switched from ON-state to OFF-state, the second switching device is switched from OFF-state to ON-state.

* * * * *